(12) United States Patent
Utsuno

(10) Patent No.: US 8,692,369 B2
(45) Date of Patent: Apr. 8, 2014

(54) SEMICONDUCTOR CHIP AND SOLAR SYSTEM

(75) Inventor: Kikuo Utsuno, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 79 days.

(21) Appl. No.: 13/176,797

(22) Filed: Jul. 6, 2011

(65) Prior Publication Data

US 2012/0133040 A1    May 31, 2012

(30) Foreign Application Priority Data

Nov. 30, 2010   (JP) .................................. 2010-266297

(51) Int. Cl.
*H01L 23/50* (2006.01)

(52) U.S. Cl.
USPC ..................... 257/735; 257/E23.079; 320/101

(58) Field of Classification Search
USPC ....................................................... 320/101
See application file for complete search history.

(56) References Cited

U.S. PATENT DOCUMENTS

2007/0229022 A1*   10/2007   Hanafusa et al. ............. 320/101

FOREIGN PATENT DOCUMENTS

JP        08-251818        9/1996

\* cited by examiner

*Primary Examiner* — David Vu
*Assistant Examiner* — Jonathan Han
(74) *Attorney, Agent, or Firm* — Volentine & Whitt, PLLC

(57) ABSTRACT

There is provided a semiconductor chip having four sides and being substantially formed in a rectangle, the semiconductor chip including: a first terminal which is located along one side of the four sides of the semiconductor chip and which is to be electrically connected to a solar cell outside the semiconductor chip; a second terminal which is located along the one side of the semiconductor chip and which is to be electrically connected to a secondary cell outside the semiconductor chip; and an interconnection line that electrically interconnects the first terminal and the second terminal.

24 Claims, 4 Drawing Sheets

SEMICONDUCTOR CHIP AND SOLAR SYSTEM

CROSS-REFERENCE TO RELATED APPLICATION

This application is based on and claims priority under 35 USC 119 from Japanese Patent Application No. 2010-266297 filed on Nov. 30, 2010, the disclosure of which is incorporated by reference herein.

BACKGROUND

1. Technical Field

The present invention relates to a semiconductor chip whose purpose is to suppress an increase in the resistance of a wire that interconnects a solar cell and a secondary cell and particularly relates to a semiconductor chip that has a feature in the layout of external connection terminals disposed on the semiconductor chip.

Further, the present invention relates to a solar system including a semiconductor chip.

2. Related Art

Japanese Patent Application Laid-Open (JP-A) No. 8-251818 discloses a charging control system having the function of controlling charging from a solar cell to a secondary cell. The charging control system is equipped with a solar cell, a secondary cell, a wire that electrically interconnects the solar cell and the secondary cell, and a backflow prevention section that is disposed on the wire and prevents backflow of electric current from the secondary cell to the solar cell.

Here, the charging control system suggested particularly from FIG. 1 of JP-A No. 8-251818 will have the configuration shown in FIG. 4. The charging control system shown in FIG. 4 is equipped with a solar cell 1, a secondary cell 2, and a semiconductor chip 3. The semiconductor chip 3 is equipped with a first terminal 4 that is electrically connected to the solar cell 1, a second terminal 5 that is electrically connected to the secondary cell 2, a wire 6 that electrically interconnects the first terminal 4 and the second terminal 5, and a backflow prevention section 7 that is formed on the wire 6 and prevents backflow of electric current from the secondary cell 2 to the solar cell 1.

However, as shown in FIG. 4, it is common in recent years that, in addition to the backflow prevention section 7, circuits and so forth having various functions are consolidated as internal circuits 8 on the semiconductor chip 3 used in the charging control system.

Consequently, when the charging control system is given a configuration where the wire 6 that electrically interconnects the solar cell 1 and the secondary cell 2 extends from one side of the semiconductor chip 3 to another side opposing that one side like in the semiconductor chip 3 used in the conventional charging control system shown in FIG. 4, the wire 6 becomes lengthy because it is dependent on the size of the internal circuits 8, and the wire resistance ends up increasing in correspondence thereto. For this reason, there is the fear that the charging control system will suffer electrical loss in the case of performing charging from the solar cell 1 to the secondary cell 2.

SUMMARY

Therefore, the present invention provides a semiconductor chip in which the length of the wire that electrically interconnects the solar cell and the secondary cell is less likely to be affected by other internal circuits and in which electrical loss in the case of performing charging from the solar cell to the secondary cell may be reduced.

A first aspect of the present invention provides a semiconductor chip having four sides and being substantially formed in a rectangle, the semiconductor chip including:

a first terminal which is located along one side of the four sides of the semiconductor chip and which is to be electrically connected to a solar cell outside the semiconductor chip;

a second terminal which is located along the one side of the semiconductor chip and which is to be electrically connected to a secondary cell outside the semiconductor chip; and an interconnection line that electrically interconnects the first terminal and the second terminal.

A second aspect of the present invention provides a semiconductor chip having four sides and being substantially formed in a rectangle, the semiconductor chip including:

a first terminal which is located along one side of the four sides of the semiconductor chip and which is to be electrically connected to a solar cell outside the semiconductor chip;

a second terminal which is located along another side of the semiconductor chip adjacent to the one side and which is to be electrically connected to a secondary cell outside the semiconductor chip; and an interconnection line that electrically interconnects the first terminal and the second terminal.

A third aspect of the present invention provides a semiconductor chip having four sides and being substantially formed in a rectangle, the semiconductor chip including:

a first terminal which is located along one side of the four sides of the semiconductor chip and supplied with electric power from a solar cell outside the semiconductor chip;

a second terminal which is located along the one side of the semiconductor chip and outputting the electric power outside the semiconductor chip; and an interconnection line that electrically interconnects the first terminal and the second terminal.

A fourth aspect of the present invention provides a solar system including:

a solar cell and;

a secondary cell; and a semiconductor chip having four sides and being substantially formed in a rectangle, wherein the semiconductor chip further including:

a first terminal which is located along one side of the four sides of the semiconductor chip and which is electrically connected to the solar cell outside the semiconductor chip;

a second terminal which is located along the one side of the semiconductor chip and which is electrically connected to the secondary cell outside the semiconductor chip; and an interconnection line that electrically interconnects the first terminal and the second terminal.

According to the semiconductor chips or the solar system pertaining to the present invention, both the first terminal that is electrically connected to the solar cell and the second terminal that is electrically connected to the secondary cell are located along one side of the four sides of the semiconductor chip formed in a rectangle, or the first terminal is located along one side and the second terminal is located along another side adjacent to that one side. Therefore, so the wire that electrically interconnects the first terminal and the second terminal is not formed extending from one side of the semiconductor chip to another side opposing that one side. For this reason, the length of the wire that electrically interconnects the solar cell and the secondary cell is less likely to be affected by other internal circuits, and electrical loss in the case of performing charging from the solar cell to the secondary cell may be decreased.

BRIEF DESCRIPTION OF THE DRAWINGS

Exemplary embodiments of the present invention will be described in detail based on the following figures, wherein.

DETAILED DESCRIPTION

Semiconductor chips pertaining to the present invention will be described in detail below with reference to the drawings.

First Exemplary Embodiment

Figure 1:
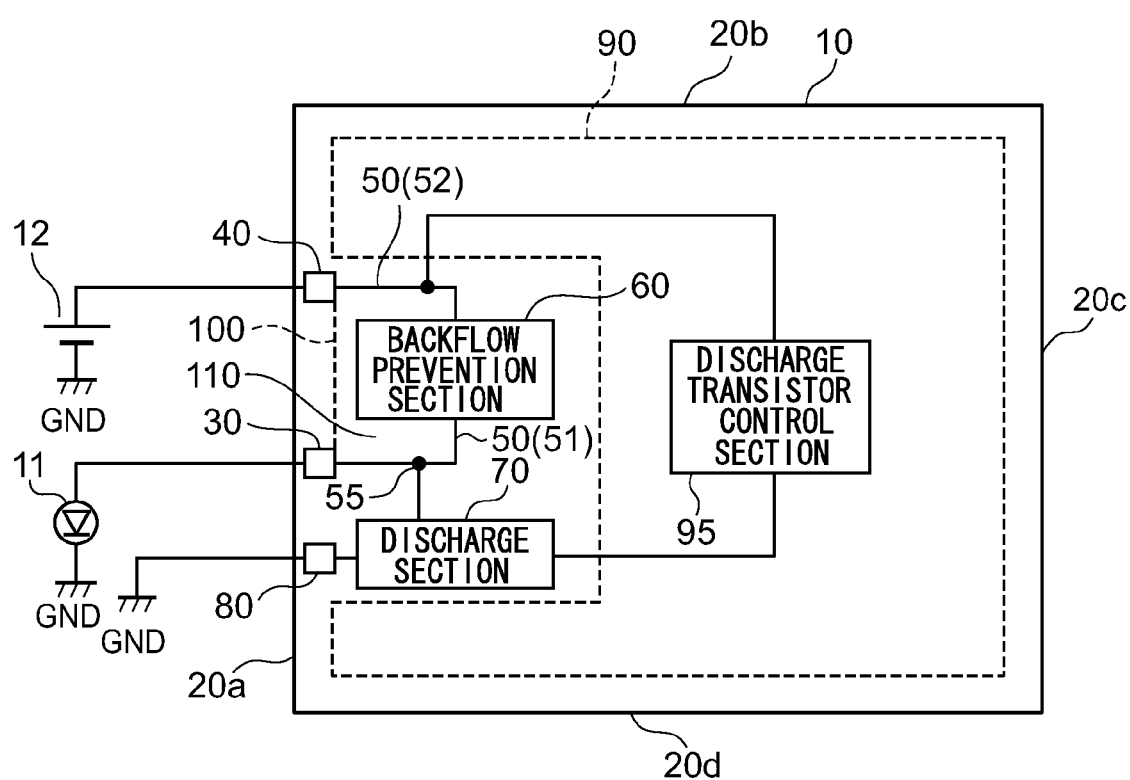
FIG. 1 is a diagram showing the configuration of a semiconductor chip 10 pertaining to a first exemplary embodiment of the present invention.

FIG. 1 shows a charging control system equipped with a semiconductor chip 10 pertaining to a first exemplary embodiment of the present invention. The charging control system is configured by the semiconductor chip 10, a solar cell 11, and a secondary cell 12.

The semiconductor chip 10 is bordered by four sides, i.e., a side 20a, a side 20b, a side 20c, and a side 20d, and is formed in a rectangle. The semiconductor chip 10 has a first terminal 30 that is located along the side 20a serving as one side of the four sides and is electrically connected to the solar cell 11, a second terminal 40 that is located along the side 20a and is electrically connected to the secondary cell 12, and a wire 50 that electrically interconnects the first terminal 30 and the second terminal 40. Charging from the solar cell 11 to the secondary cell 12 is performed via the first terminal 30, the wire 50, and the second terminal 40.

The first terminal 30 is located in a position along and closest to the side 20a of the sides 20a to 20d. The first terminal 30 is connected to the solar cell 11 and fulfills the role of a window through which the semiconductor chip 10 receives electric power supplied from the solar cell 11.

The second terminal 40 is located in a position along and closest to the side 20a of the sides 20a to 20d. The second terminal 40 is connected to the secondary cell 12 and fulfills the role of a window that transfers to the secondary cell 12 the electric power supplied from the solar cell 11 and outputted from the semiconductor chip 10. The second terminal 40 is located adjacent to the first terminal 30.

The wire 50 as an interconnection line is a wire that electrically interconnects the first terminal 30 and the second terminal 40. Specifically, the wire 50 as the interconnection line comprises a first line 51 electrically connected to the first terminal 30 and a second line 52 electrically connected to the second terminal 40. The wire 50 transfers to the second terminal 40 the electric power of the solar cell 11 inputted from the first terminal 30 in the case of performing charging from the solar cell 11 to the secondary cell 12.

Further, as shown in FIG. 1, the wire 50 as the interconnection line has a length which is shorter than a distance from the one side 20a to opposite side 20d of the one side 20a.

A backflow prevention section 60 is disposed on the wire 50. In more precisely, the backflow prevention section 60 is disposed at the middle of the wire 50. That is, the backflow prevention section 60 is electrically connected to both of the first line 51 and the second line 52. The backflow prevention section 60 prevents electric current of the secondary cell 12 from flowing back toward the solar cell 11 as a result of the voltage of the solar cell 11 having dropped. The backflow prevention section 60 is configured by a switch element, for example. In a case where the backflow prevention section 60 is configured by a switch element, it may be given a configuration where the switch element is turned on in the case of performing charging from the solar cell 11 to the secondary cell 12 and where the switch element is turned off to prevent backflow from the secondary cell 12 to the solar cell 11 in a case where the voltage of the solar cell 11 is lower than the voltage of the secondary cell 12. Further, rather than a switch element, a diode may simply be used for the backflow prevention section 60, or a combination of a switch element and a diode may be used for the backflow prevention section 60. The backflow prevention section 60 is not limited to this.

A discharge section 70 is connected to the wire at a connection point 55. The discharge section 70 is disposed to prevent overcharging from the solar cell 11 to the secondary cell 12. The discharge section 70 discharges the electric power supplied from the solar cell 11 to the wire 50 to prevent overcharging from the solar cell 11 to the secondary cell 12 when the voltage accumulated in the secondary cell 12 becomes equal to or greater than a predetermined value.

It is preferable for the discharge section 70 to be located between the wire 50 and a side that is different from the side 20a of the four sides of the semiconductor chip 10, that is, at least any one side of the side 20b, the side 20c, and the side 20d. When the discharge section 70 is located between the wire 50 and any one side of the side 20b, the side 20c, and the side 20d, in a case where the semiconductor chip 10 is equipped with a region 110 surrounded by the wire 50 and a line segment 100 joining together the first terminal 30 and the second terminal 40, the discharge section 70 is located outside the region 110 and is no longer located inside the region 110. Therefore, a wire layout of the wire 50 that is not dependent on the forming area of the discharge section 70 becomes possible. Because the degree of freedom of the layout of the wire 50 improves in this way, it becomes possible to form the wire 50 shorter compared to a case where the discharge section 70 is located inside the region 110, so the wire resistance of the wire 50 may be kept smaller.

A third terminal 80 is a terminal to which a ground potential GND is supplied from outside the semiconductor chip 10, and the third terminal 80 is connected to the discharge section 70. The electric current supplied from the solar cell 11 and flowing in the wire 50 flows to the ground potential GND via the third terminal 80 and the discharge section 70 connected to the wire 50 in a case where it is necessary to prevent overcharging from the solar cell 11 to the secondary cell 12.

An internal circuit 90 is formed in accordance with various design matters in the semiconductor chip 10. The internal circuit 90 may, for example, be a circuit that monitors the voltage accumulated in the secondary cell 12 and performs predetermined control with respect to the discharge section 70 in a case where the voltage of the secondary cell 12 has become equal to or greater than a predetermined value. The internal circuit 90 may also, for example, be a circuit having the function of controlling the switch element used for the backflow prevention section 60. The internal circuit 90 is not limited to these, and various circuits may be formed.

In the internal circuit 90, a discharge transistor control section 95 is disposed so as to be electrically connected to each of the discharge section 70, the backflow prevention section 60 and the second terminal 40.

Figure 2:
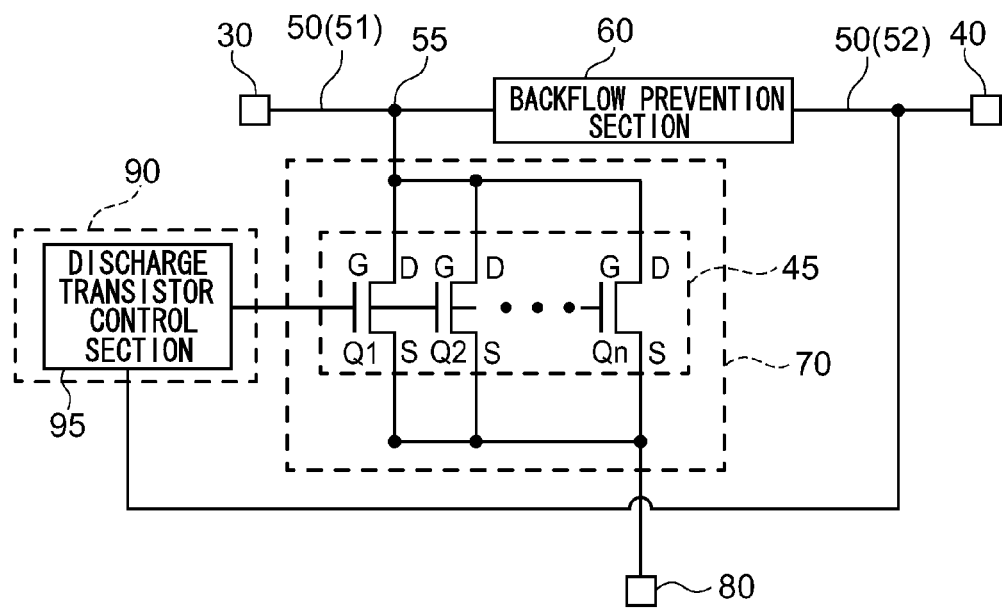
FIG. 2 is a detailed circuit diagram of a discharge section 70 formed in the semiconductor chip 10 pertaining to the first exemplary embodiment.

FIG. 2 is one circuit diagram of the discharge section 70 formed in the semiconductor chip 10 pertaining to the present invention and shows the circuit configuration of the first terminal 30, the second terminal 40, the wire 50, the backflow prevention section 60, the discharge section 70, the third terminal 80, and the internal circuit 90. Regarding portions in FIG. 2 that are the same as those in FIG. 1, identical numbers are given thereto and description thereof will be omitted. Further, FIG. 2 only shows the circuit configuration and does not show the placement of each portion in the semiconductor chip 10.

The discharge section 70 is configured by a discharge transistor section 45 in which are formed multiple discharge transistors Q1, Q2, ..., Qn that are N-type transistors. The drains D of the discharge transistors Q1, Q2, ..., Qn formed in the discharge transistor section 45 are connected to the wire 50 at the connection point 55 on the wire 50. The sources S of the discharge transistors Q1, Q2, ..., Qn are connected to the third terminal 80. The gates G of the discharge transistors Q1, Q2, ..., Qn are, for example, connected as a current mirror to a discharge transistor control section 95 that is connected to the wire 50 and formed as the internal circuit 90. The switching of the discharge transistors Q1, Q2, ..., Qn on and off is controlled by the discharge transistor control section 95. The discharge transistors Q1, Q2, ..., Qn may also be P-type transistors.

As mentioned above, the discharge section 70 is used to prevent overcharging from the solar cell 11 to the secondary cell 12. One example of the discharge action of the discharge section 70 will be described below. N-type transistors are used as the discharge transistors below.

First, in a case where the voltage of the secondary cell 12 is equal to or less than a predetermined value, 0 V is supplied from the discharge transistor control section 95 to the gates of the discharge transistors Q1, Q2, ..., Qn, and the discharge transistors Q1, Q2, ..., Qn are all off. Next, in a case where the voltage of the secondary cell 12 has become equal to or greater than the predetermined value, the discharge transistor control section 95 senses this, and a predetermined voltage is applied from the discharge transistor control section 95 to the gates of the discharge transistors Q1, Q2, ..., Qn. Because of this, the discharge transistors Q1, Q2, ..., Qn are turned on. When the discharge transistors Q1, Q2, ..., Qn are turned on, the electric current supplied from the solar cell 11 to the wire 50 via the first terminal 30 begins to flow to the discharge section 70. That is, the electric current flowing from the solar cell 11 to the secondary cell 12 decreases. Because of the above action, overcharging from the solar cell 11 to the secondary cell 12 is prevented.

Here, the discharge characteristic of the discharge section 70 will be described. The discharge characteristic of the discharge section 70 represents the extent to which the electric current flowing through the wire 50 flows to the discharge section 70 in a case where the discharge transistors Q1, Q2, ..., Qn have been turned on. The higher this discharge characteristic is, the more the electric current flowing in the wire 50 can be drawn to the discharge section 70 to suppress overcharging from the solar cell 11 to the secondary cell 12. The discharge characteristic of the discharge section 70 in the semiconductor chip 10 is dependent on the size of the wire resistance from the first terminal 30 to the third terminal 80. Consequently, by making the wire resistance from the first terminal 30 to the third terminal 80 smaller, a higher discharge characteristic can be obtained. That is, the more the electric current flowing through the wire 50 to the second terminal 40 can be drawn to the discharge section 70.

The placement of the discharge section 70 in the semiconductor chip 10 by which a higher discharge characteristic of the discharge section 70 can be obtained will be described using FIG. 1 again.

As shown in FIG. 1, it is preferable for the discharge section 70 to be connected between the first terminal 30 and the backflow prevention section 60 on the wire 50. In other words, it is preferable for the discharge section 70 to be connected to the wire 50 at a position on the wire 50 closer to the first terminal 30 than the backflow prevention section 60. Because of this, it becomes possible to shorten the wire length from the first terminal 30 to the discharge section 70 and decrease the wire resistance compared to a case where the discharge section 70 is connected between the second terminal 40 and the backflow prevention section 60 on the wire 50, so the discharge characteristic of the discharge section 70 may be made higher.

Further, it is preferable for the wire resistance of a portion in the wire 50 from the first terminal 30 to the connection point 55 with the discharge section 70 (referred to as "first portion" hereafter) to be made smaller than the wire resistance of other portion in the wire 50 from the second terminal 40 to the connection point 55 with the discharge section 70 (referred to as "second portion" hereafter). As one example of this, the length of the first portion of the wire 50 from the first terminal 30 to the connection point 55 with the discharge section 70 may be shorter than the length of the second portion of the wire 50 from the second terminal 40 to the connection point 55 with the discharge section 70.

Further, it is preferable for the third terminal 80 to be located along a side which is the closest of the four sides of the semiconductor chip 10 to the discharge section 70. When the third terminal 80 is located along the closest side from the place where the discharge section 70 is placed, the length of the wire that interconnects the discharge section 70 and the third terminal 80 may be shortened the most and the wire resistance of that wire can be reduced the most compared to a case where the third terminal 80 is located along another side, so the discharge characteristic of the discharge section 70 can be made higher. In the semiconductor chip 10 shown in FIG. 1, it is preferable for the third terminal 80 to be located in a position along and closest to the side 20a of the sides 20a to 20d.

FIG. 1 shows a case where the first terminal 30 and the second terminal 40 are located adjacent to each other along the side 20a, but the semiconductor chip 10 is not limited to this, and another external terminal may also be formed between the first terminal 30 and the second terminal 40. This is because, even if another external terminal were to be formed between the first terminal 30 and the second terminal 40, an increase in the wire resistance of the wire 50 may be suppressed at that point in time because the first terminal 30 and the second terminal 40 are not formed on mutually opposing sides in the first exemplary embodiment of the present invention. However, it is preferable for another external terminal to not be formed between the first terminal 30 and the second terminal 40 and for the first terminal 30 and the second terminal 40 to be formed adjacent to each other. The reason for this is because, in a case where another external terminal is formed between the first terminal 30 and the second terminal 40, there are cases where the need to give the wire 50 a layout avoiding the other external terminal arises, so there arise cases where the wire length of the wire 50 becomes dependent on and decided by the placement of the other external terminal and there is the fear that this will lead to a drop in the degree of freedom of the layout of the wire 50, but when the first terminal 30 and the second terminal 40 are located adjacent to each other, the wire length of the wire 50 may be decided without being dependent on the placement of the other external terminal, and therefore it becomes possible to further suppress an increase in the wire resistance of the wire 50 without leading to a drop in the degree of freedom of the layout of the wire 50.

According to the semiconductor chip 10 pertaining to the first exemplary embodiment of the present invention, firstly, both the first terminal 30 that is electrically connected to the solar cell 11 and the second terminal that is electrically connected to the secondary cell 12 are located along the side 20a of the semiconductor chip 10 formed in a rectangle. Thus, the wire 50 that electrically interconnects the first terminal 30 and the second terminal 40 is not formed extending from one side of the semiconductor chip 10 to another side opposing that one side. For this reason, the length of the wire 50 that electrically interconnects the solar cell 11 and the secondary cell 12 is less likely to be affected by the other internal circuit 90, and electrical loss in the case of performing charging from the solar cell 11 to the secondary cell 12 may be decreased.

Secondly, the discharge section 70 is located between the wire 50 and a side that is different from the side 20a of the four sides of the semiconductor chip 10. That is, at least any one side of the side 20b, the side 20c, and the side 20d. Thus, a wire layout of the wire 50 that is not dependent on the forming area of the discharge section 70 becomes possible, and the wire resistance of the wire 50 may be kept smaller.

Thirdly, the discharge section 70 is connected between the first terminal 30 and the backflow prevention section 60 on the wire 50. Thus, the wire length from the first terminal 30 to the discharge section 70 can be shortened and the wire resistance may be decreased compared to a case where the discharge section 70 is connected between the second terminal 40 and the backflow prevention section 60 on the wire 50.

Fourthly, the third terminal 80 is located along the closest side from the place where the discharge section 70 is placed of the four sides of the semiconductor chip 10. Thus, the length of the wire that interconnects the discharge section 70 and the third terminal 80 may be shortened the most and the wire resistance of the wire can be reduced the most compared to a case where the third terminal 80 is located along another side.

Fifthly, the first terminal 30 and the second terminal 40 are located adjacent to each other along the side 20a. Thus, this does not lead to a drop in the degree of freedom of the layout of the wire 50 caused by another external terminal, so an increase in the wire resistance of the wire 50 may be suppressed.

Second Exemplary Embodiment

Figure 3:
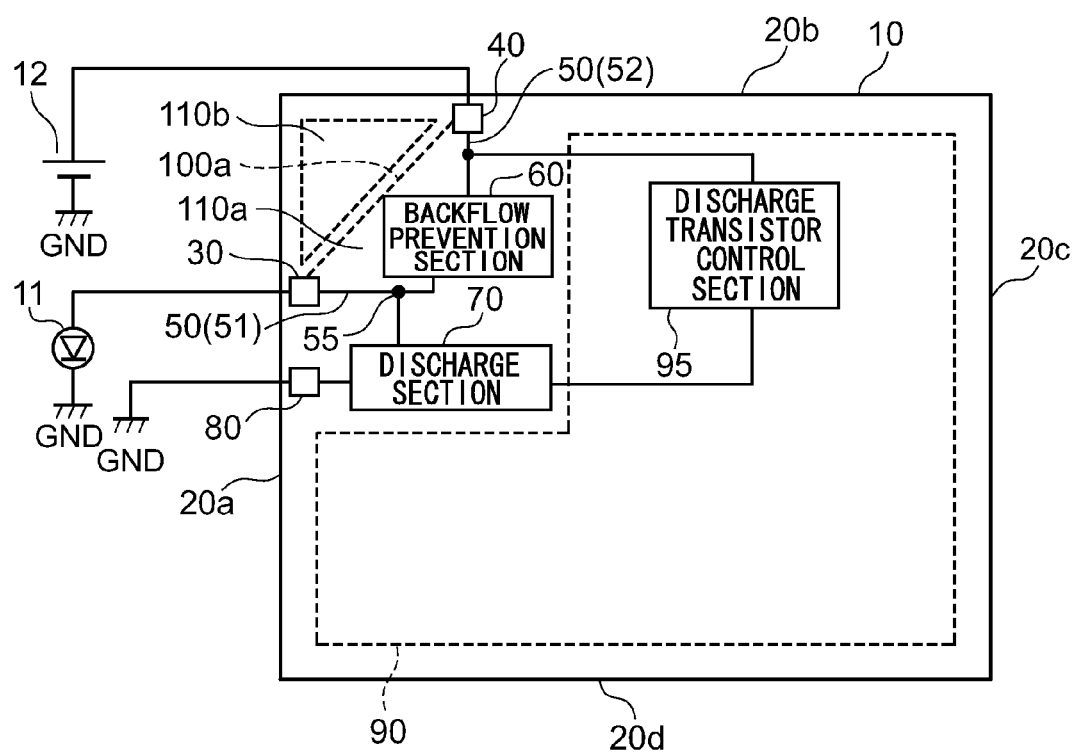
FIG. 3 is a diagram showing the configuration of a semiconductor chip 10 pertaining to a second exemplary embodiment of the present invention.
Figure 4:
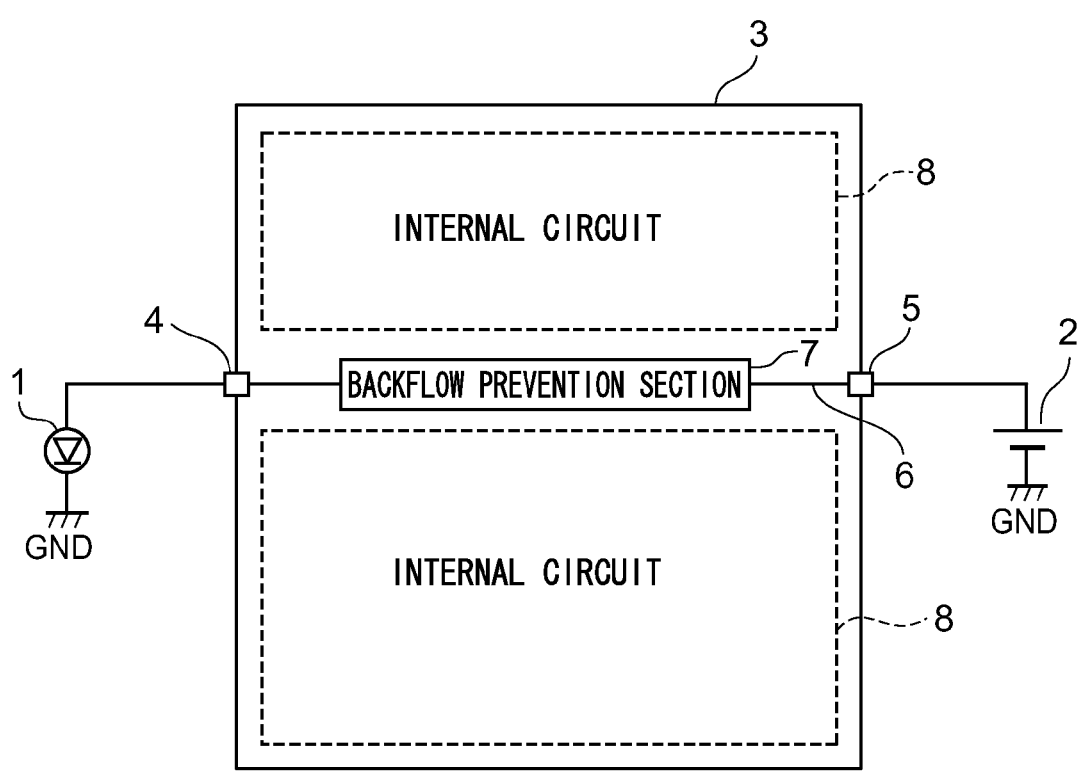
FIG. 4 is a diagram for describing a problem in a charging control system recalled from FIG. 1 disclosed in JP-A No. 8-251818.

FIG. 3 shows a charging control system equipped with a semiconductor chip 10 pertaining to a second exemplary embodiment of the present invention. The charging control system is configured by the semiconductor chip 10, a solar cell 11, and a secondary cell 12. Regarding configurations that are identical to those in the charging control system described in the first exemplary embodiment of the present invention, identical numbers will be given thereto and description thereof will be omitted.

The semiconductor chip 10a is bordered by four sides. i.e., a side 20a, a side 20b, a side 20c, and a side 20d, and is formed in a rectangle. The semiconductor chip 10a has a first terminal 30 that is located along the side 20a serving as one side of the four sides and is electrically connected to the solar cell 11, a second terminal 40 that is located along the side 20b serving as another side adjacent to the side 20a and is electrically connected to the secondary cell 12, and a wire 50 that electrically interconnects the first terminal 30 and the second terminal 40.

In the charging control system pertaining to the second exemplary embodiment of the present invention, what differs from the charging control system pertaining to the first exemplary embodiment is that the second terminal 40 is located along the side 20b adjacent to the side 20a.

The second terminal 40 is located in a position along and closest to the side 20b of the sides 20a to 20d. The second terminal 40 is connected to the secondary cell 12 and fulfills the role of a window that transfers to the secondary cell 12 the electric power supplied from the solar cell 11 and outputted from the semiconductor chip 10. The second terminal 40 is located adjacent to the first terminal 30.

It is preferable for the discharge section 70 to be located between the wire 50 and a side of the four sides of the semiconductor chip 10 that is different from the side 20a and the side 20b of the four sides of the semiconductor chip 10, i.e., either one side of the side 20c and the side 20d. When the discharge section 70 is located between the wire 50 and either one side of the side 20c and the side 20d, in a case where the semiconductor chip 10 is equipped with a region 110a surrounded by the wire 50 and a line segment 100a joining together the first terminal 30 and the second terminal 40, the discharge section 70 is located outside the region 110a and is no longer located inside the region 110a. Therefore, a wire layout of the wire 50 that is not dependent on the forming area of the discharge section 70 becomes possible, the wire 50 may be formed shorter compared to a case where the discharge section 70 is located inside the region 110a, and the wire resistance of the wire 50 can be kept smaller.

In the semiconductor chip 10 pertaining to the second exemplary embodiment, it is preferable for the discharge section 70 to be located inside a region 110b surrounded by the side 20a, the side 20b, and the line segment 100a. For example, in a case where the wire 50 is formed on the shortest path between the first terminal 30 and the second terminal 40, i.e., such that the wire 50 becomes shortest, with the intention of suppressing an increase in the wire resistance, there are cases where the region 110b becomes an unused region. In this case, it is more preferable for the discharge section 70 to be located inside the region 110b in order to effectively utilize the region 110b. Further, it is preferable to place the discharge section 70 in the region 110b and effectively utilize the region 110b even not in the case of forming the wire 50 such that the wire 50 becomes shortest.

Further, it is preferable for the discharge section 70 to be connected between the first terminal 30 and the backflow prevention section 60 on the wire 50. In other words, it is preferable for the discharge section 70 to be connected to the wire 50 at a position on the wire 50 closer to the first terminal 30 than the backflow prevention section 60. Because of this, it becomes possible to shorten the wire length from the first terminal 30 to the discharge section 70 and decrease the wire resistance compared to a case where the discharge section 70 is connected between the second terminal 40 and the backflow prevention section 60 on the wire 50. Therefore, the discharge characteristic of the discharge section 70 may be made higher.

Further, it is preferable for the size of the wire resistance in the wire 50 from the first terminal 30 to the discharge section 70 to be smaller than the wire resistance in the wire 50 from the second terminal 40 to the discharge section 70. As one example of this, the length of the wire 50 from the first terminal 30 to the discharge section 70 may be shorter than the length of the wire 50 from the second terminal 40 to the discharge section 70.

Further, it is preferable for the third terminal 80 to be located a side which is the closest of the four sides of the semiconductor chip 10 to the discharge section 70. When the third terminal 80 is located along the closest side from the place where the discharge section 70 is placed, the length of the wire that interconnects the discharge section 70 and the third terminal 80 may be shortened the most and the wire resistance of that wire may be reduced the most compared to a case where the third terminal 80 is located on another side. Therefore, the discharge characteristic of the discharge section 70 may be made higher. In the semiconductor chip 10 shown in FIG. 3, it is preferable for the third terminal 80 to be located in a position along and close to the side 20a of the sides 20a to 20d.

FIG. 3 shows a case where the first terminal 30 and the second terminal 40 are formed adjacent to each other, but the semiconductor chip 10 is not limited to this, and another external terminal may also be formed between the first terminal 30 and the second terminal 40. This is because, even if another external terminal were to be formed between the first terminal 30 and the second terminal 40, an increase in the wire resistance of the wire 50 may be suppressed at that point in time because the first terminal 30 and the second terminal 40 are not formed on mutually opposing sides in the second exemplary embodiment of the present invention. However, it is preferable for another external terminal to not be formed between the first terminal 30 and the second terminal 40 and for the first terminal 30 and the second terminal 40 to be formed adjacent to each other. The reason for this is because, in a case where another external terminal is formed between the first terminal 30 and the second terminal 40, there are cases where the need to give the wire 50 a layout avoiding the other external terminal arises, so there arise cases where the wire length of the wire 50 becomes dependent on and decided by the placement of the other external terminal and there is the fear that this will lead to a drop in the degree of freedom of the layout of the wire 50, but when the first terminal 30 and the second terminal 40 are formed adjacent to each other, the wire length of the wire 50 may be decided without being dependent on the placement of the other external terminal, and therefore it becomes possible to further suppress an increase in the wire resistance of the wire 50 without leading to a drop in the degree of freedom of the layout of the wire 50.

According to the semiconductor chip 10 pertaining to the second exemplary embodiment of the present invention, firstly, the first terminal 30 that is electrically connected to the solar cell 11 is located along the side 20a of the semiconductor chip 10 formed in a rectangle, and the second terminal 40 that is electrically connected to the secondary cell 12 is located along the side 20b adjacent to the side 20a. Thus, the wire 50 that electrically interconnects the first terminal 30 and the second terminal 40 is not formed extending from one side of the semiconductor chip 10 to another side opposing that one side. For this reason, the length of the wire 50 that electrically interconnects the solar cell 11 and the secondary cell 12 is less likely to be affected by the other internal circuit 90, and electrical loss in the case of performing charging from the solar cell 11 to the secondary cell 12 may be decreased.

Secondly, the discharge section 70 is located between the wire 50 and a side of the four sides of the semiconductor chip 10 that is different from the side 20a and the side 20b, i.e., either one side of the side 20c and the side 20d. Thus, a wire layout of the wire 50 that is not dependent on the forming area of the discharge section 70 becomes possible, and an increase in the wire resistance may be kept smaller.

Thirdly, the discharge section 70 is connected between the first terminal 30 and the backflow prevention section 60 on the wire 50. Thus, the wire length from the first terminal 30 to the discharge section 70 may be shortened and the wire resistance may be decreased compared to a case where the discharge section 70 is connected between the second terminal 40 and the backflow prevention section 60 on the wire 50.

Fourthly, the third terminal 80 is located along a side which is the closest of the four sides of the semiconductor chip 10 to the discharge section 70. Thus, the length of the wire that interconnects the discharge section 70 and the third terminal 80 may be shortened the most and the wire resistance of the wire may be reduced the most compared to a case where the third terminal 80 is located along another side.

Fifthly, the first terminal 30 and the second terminal 40 are formed adjacent to each other. Thus, this does not lead to a drop in the degree of freedom of the layout of the wire 50 caused by another external terminal, so an increase in the wire resistance of the wire 50 may be suppressed.

What is claimed is:

1. A semiconductor chip having four side surfaces, the semiconductor chip comprising:
   a first electrode formed on the semiconductor chip and located closest to one side surface of the four side surfaces of the semiconductor chip, and which is electrically connected to a solar cell outside the semiconductor chip;
   a second electrode formed on the semiconductor chip and located closest to the one side surface of the four side surfaces of the semiconductor chip, and which is electrically connected to a secondary cell outside the semiconductor chip; and
   an interconnection line that electrically interconnects the first electrode and the second electrode.

2. The semiconductor chip according to claim 1, further comprising a discharge section that is connected to a point of the interconnection line and discharges electric power supplied from the solar cell, wherein
   the discharge section is located outside a region which is surrounded by the interconnection line and a line segment joining together the first electrode and the second electrode.

3. The semiconductor chip according to claim 2, wherein the interconnection line comprising:
   a first portion from the first electrode to the point of the interconnection line; and
   a second portion from the second electrode to the point of the interconnection line, and
   wherein a resistance value of the first portion is smaller than that of the second portion.

4. The semiconductor chip according to claim 2, wherein the interconnection line comprising:
   a first portion from the first electrode to the point of the interconnection line; and
   a second portion from the second electrode to the point of the interconnection line, and
   wherein a length of the first portion is shorter than that of the second portion.

5. The semiconductor chip according to claim 2, wherein the interconnection line comprises a first line which is electrically connected to the first electrode and a second line which is electrically connected to the second electrode, further comprising a backflow prevention section that is connected to the first line and the second line, that prevents backflow of electric current from the secondary cell to the solar cell, and wherein the discharge section is connected with the first line of the interconnection line.

6. The semiconductor chip according to claim 2, further comprising:

a third electrode, which is electrically connected to ground and the discharge section and is located along a side surface which is the closest of the four side surfaces to the discharge section.

7. The semiconductor chip according to claim 6, wherein the closest of the four side surfaces to the discharge section is the one side surface.

8. The semiconductor chip according to claim 1, wherein the first electrode and the second electrode are formed adjacent to each other.

9. The semiconductor chip according to claim 1, wherein the interconnection line has a length which is shorter than a distance from the one side surface to a side surface opposite the one side surface.

10. The semiconductor chip according to claim 1, wherein the interconnection line has a back flow section that prevent prevents backflow of electric current from the secondary cell to the solar cell.

11. A semiconductor chip having four side surfaces, the semiconductor chip comprising:

a first electrode formed on the semiconductor chip and located closest to one side surface of the four side surfaces of the semiconductor chip, and which is electrically connected to a solar cell outside the semiconductor chip;

a second electrode formed on the semiconductor chip and located closest to another side surface of the four side surfaces of the semiconductor chip adjacent to the one side surface, and which is electrically connected to a secondary cell outside the semiconductor chip; and an interconnection line that electrically interconnects the first electrode and the second electrode.

12. The semiconductor chip according to claim 11, further comprising a discharge section that is connected to a point of the interconnection line and discharges electric power supplied from the solar cell, wherein the discharge section is located outside a region which is surrounded by the interconnection line and a line segment joining together the first electrode and the second electrode.

13. The semiconductor chip according to claim 12, the interconnection line comprising:

a first portion from the first electrode to the point of the interconnection line; and a second portion from the second electrode to the point of the interconnection line, and wherein a resistance of the first portion is smaller than that of the second portion.

14. The semiconductor chip according to claim 12, the interconnection line comprising:

a first portion from the first electrode to the point of the interconnection line; and a second portion from the second electrode to the point of the interconnection line, and wherein a length of the first portion is shorter than that of the second portion.

15. The semiconductor chip according to claim 12, wherein the interconnection line comprises a first line which is electrically connected to the first electrode and a second line which is electrically connected to the second electrode, further comprising a backflow prevention section that is connected to the first line and the second line, that prevents backflow of electric current from the secondary cell to the solar cell, and wherein the discharge section is connected with the first line of the interconnection line.

16. The semiconductor chip according to claim 12, further comprising:

a third electrode, which is electrically connected to ground and the discharge section and is located along a side surface which is the closest side surface of the four side surfaces to the discharge section.

17. The semiconductor chip according to claim 16, wherein the closest of the four side surfaces to the discharge section is the one side surface.

18. The semiconductor chip according to claim 11, wherein the first electrode and the second electrode are formed adjacent to each other.

19. The semiconductor chip according to claim 11, further wherein the interconnection line has a length which is shorter than a distance from the one side surface to a side surface opposite the one side surface.

20. The semiconductor chip according to claim 11, wherein the interconnection line has a back flow section that prevent prevents backflow of electric current from the secondary cell to the solar cell.

21. A semiconductor chip having four side surfaces, the semiconductor chip comprising:

a first electrode formed on the semiconductor chip located closest to one side surface of the four side surfaces of the semiconductor chip, and supplied with electric power from a solar cell outside the semiconductor chip;

a second electrode formed on the semiconductor chip and located closest to the one side surface of the semiconductor chip, and outputting the electric power outside the semiconductor chip; and an interconnection line that electrically interconnects the first electrode and the second electrode.

22. The semiconductor chip according to claim 21, wherein the interconnection line has a back flow section that prevent prevents backflow of electric current from a secondary cell to the solar cell.

23. A solar system comprising:

a solar cell and;

a secondary cell; and a semiconductor chip having four side surfaces, wherein the semiconductor chip further comprising:

a first electrode formed on the semiconductor chip and located closest to one side surface of the four side surfaces of the semiconductor chip, and which is electrically connected to the solar cell outside the semiconductor chip;

a second electrode formed on the semiconductor chip and located closest to the one side surface of the semiconductor chip, and which is electrically connected to the secondary cell outside the semiconductor chip; and an interconnection line that electrically interconnects the first electrode and the second electrode.

24. The solar system according to claim 23, wherein the interconnection line has a back flow section that prevent prevents backflow of electric current from the secondary cell to the solar cell.

* * * * *